US008653716B2

(12) United States Patent
Hentz et al.

(10) Patent No.: US 8,653,716 B2
(45) Date of Patent: Feb. 18, 2014

(54) METHOD AND DEVICE FOR SUPPRESSING HYSTERESIS OF RESONATORS THROUGH SIMULTANEOUS RESONANCE (75) Inventors: Sebastien Hentz, Grenoble (FR); Najib Kacem, Annemasse (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 124 days.

(21) Appl. No.: 13/040,670

(22) Filed: Mar. 4, 2011

(65) Prior Publication Data
US 2011/0221301 A1 Sep. 15, 2011

(30) Foreign Application Priority Data
Mar. 11, 2010 (FR) ...................... 10 51750

(51) Int. Cl.
*H02N 1/00* (2006.01)
*H03L 7/00* (2006.01)

(52) U.S. Cl.
USPC .......................................... 310/309

(58) Field of Classification Search
USPC ..................... 310/309; 331/34, 35
See application file for complete search history.

(56) References Cited

U.S. PATENT DOCUMENTS 7,800,282 B2 * 9/2010 Ayazi et al. .................... 310/317
2011/0102095 A1 * 5/2011 Steeneken et al. ............ 332/175

FOREIGN PATENT DOCUMENTS

WO  WO 2009153754 A2 * 12/2009 ............... H03D 7/00

OTHER PUBLICATIONS

U.S. Appl. No. 13/375,627, filed Dec. 1, 2011, Hentz, et al.
Preliminary Search Report issued Jan. 18, 2011 in France Application No. 1051750 (With English Translation of Category of Cited Documents).
N. Kacem, et al., "Nonlinear dynamics of nanomechanical beam resonators: improving the performance of NEMS-based sensors", Nanotechnology, vol. 20, No. 17, Jun. 16, 2009, pp. 1-11.
L. C. Shao, et al., "The nonlinearity cancellation phenomenon in micromechanical resonators", Journal of Micromechanics and Microengineering, vol. 18, No. 6, May 6, 2008, pp. 1-9.
J. Juillard, et al., "Large amplitude dynamics of micro-/nanomechanical resonators actuated with electrostatic pulses", Journal of Applied Physics, vol. 107, No. 1, Jan. 7, 2010, 10 pages.
M. Agarwal, et al., "Non-Linearity Cancellation in MEMS Resonators for Improved Power-Handling", IEEE International Electron Devices Meeting, 2005, 4 pages.
Ville Kaajakari, et al., "Phase Noise in Capacitively Coupled Micromechanical Oscillators", IEEE Transactions on Ultrasonics, Ferroelectrics, and Frequency Control, vol. 52, No. 12, Dec. 2005, pp. 2322-2331.

(Continued)

*Primary Examiner* — Tran Nguyen
*Assistant Examiner* — Thomas Truong
(74) *Attorney, Agent, or Firm* — Oblon, Spivak, McClelland, Maier & Neustadt, L.L.P.

(57) ABSTRACT

An electromechanical resonator including: at least one deformable element, and at least one electrode that simultaneously supplies, to the at least one deformable element, at least one first actuating force at a first frequency, and a second actuating force at a second frequency, the first and the second frequencies creating at least two simultaneous resonances with a primary resonance at a frequency $\omega_0$ equal to the first frequency and the second frequency being equal to a subharmonic resonant frequency ($k\omega_0$, with k>1) of the resonator, or to a superharmonic resonant frequency ($\omega_0/k$, with k>1).

20 Claims, 6 Drawing Sheets

(56) References Cited

OTHER PUBLICATIONS

N. Kacem, et al., "Dynamic range enhancement of nonlinear nanomechanical resonant cantilevers for highly sensitive NEMS gas/mass sensor applications", J. Micromech. Microeng., vol. 20, 2010, 9 pages.

I. Kozinsky, et al., "Tuning nonlinearity, dynamic range, and frequency of nanomechanical resonators", Applied Physics Letters, vol. 88, 2006, 3 pages.

N. Kacem, et al., "Bifurcation topology tuning of a mixed behavior in nonlinear micromechanical resonators", Applied Physics Letters, vol. 95, 2009, 3 pages.

J. Arcamone, et al., "Full-wafer fabrication by nanostencil lithography of micro/nanomechanical mass sensors monolithically integrated with CMOS", Nanotechnology, vol. 19, 2008, pp. 1-13.

Ville Kaajakari, et al., "Square-Extensional Mode Single-Crystal Silicon Micromechanical RF-resonator", Proc. Transducers 03, Int. Conf. Solid State Sens. Actuators, 2003, pp. 951-954.

Ville Kaajakari, et al., "Square-Extensional Mode Single-Crystal Silicon Micromechanical Resonator for Low-Phase-Noise Oscillator Applications", IEEE Electron Device Letters, vol. 25, No. 4, Apr. 2004, pp. 173-175.

* cited by examiner

METHOD AND DEVICE FOR SUPPRESSING HYSTERESIS OF RESONATORS THROUGH SIMULTANEOUS RESONANCE

TECHNICAL FIELD AND PRIOR ART

The invention relates to the field of resonators, particularly of the MEMS or NEMS type.

The applications in question can be resonant sensors, inertial sensors for example, or gas or mass sensors.

Another application is that of creating oscillators for time base application.

In all of these fields, performance (resolution of acceleration, concentration, mass or stability of the generated frequency) is proportional to the signal-to-noise ratio which can be expressed, in a mechanical displacement of the resonator for example, by $$SNR = \frac{P_0}{S_X}$$

where $S_X$ is the noise spectral density and $P_0$ the carrier power, namely $$P_0 = \frac{1}{2}A^2,$$

where A is the vibration amplitude of the mechanical resonator.

To improve the performance of the resonator, the largest possible resonator drive amplitude A is sought.

Figure 1:
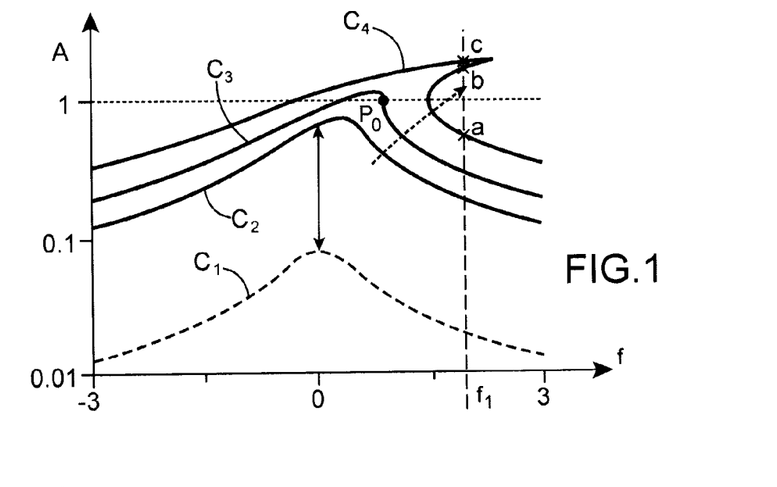
FIGS. 1, 2 and 4 illustrate known behaviour of resonators, FIG. 3 being a known resonator structure.
Figure 2:
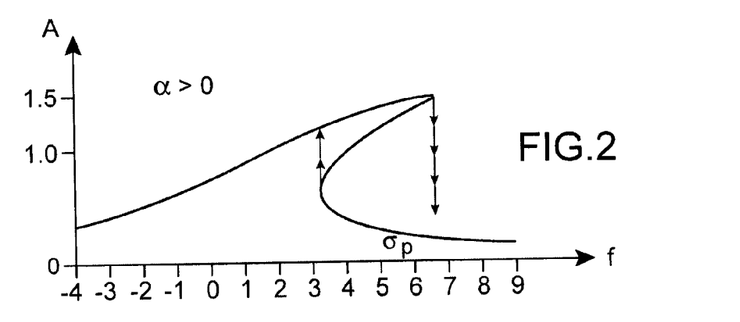

The person skilled in the art always limits this amplitude to a value lower than the so-called critical amplitude, called $A_c$, beyond which the vibration regime becomes nonlinear. The emergence of this nonlinear regime is illustrated in FIG. 1. In this figure are shown curves $C_n$ showing the change in the resonator response as a function of frequency, or of the difference between it and the resonant frequency. It is seen that some of these curves, curves $C_1$, $C_2$ in this case, show a linear regime. On the contrary, as amplitude increases, nonlinear phenomena appear, as is the case for curves $C_3$, $C_4$ in FIG. 1. This nonlinearity manifests itself, for certain frequencies such as frequency f1, by several possible amplitudes: for example a line parallel to the ordinate axis and passing through frequency f1 intersects curve $C_4$ at several points a, b, c. This effect appears even more clearly in FIG. 2.

In other words, in this nonlinear regime, the resonator is no longer stable. In a certain area of this regime, 3 amplitudes are possible for a given frequency $f_1$. The resonator can therefore "jump" abruptly from one amplitude to the other when it is in open loop operation at a certain frequency. The amplitude assumed by the resonator depends also on the initial conditions and external perturbations. The resonator then becomes difficult to control.

Consequently, when the frequency range is swept upward or downward, abrupt jumps in amplitude can be observed. In addition, the path that is followed is different in one direction and in the other: a hysteresis is observed, which is especially visible on the schematic in FIG. 2, meaning that depending on the direction in which the frequency varies, the change in amplitude is not the same.

The emergence of a nonlinear regime is also linked to a degradation of the noise: in fact, noise (low or high frequency) is introduced by the nonlinear component of the resonator, and adds noise at the frequency of interest, as shown by V. Kaajakari and al. in the article that appeared in 20 *IEEE Trans. Ultrason. Ferroelectr. Freq. Control,* 52, 2322-2331 (2005). Thus, the amplitude and hence the power of the carrier is increased, but at the same time the noise is degraded, which completely eliminates the advantage of increasing amplitude.

Consequently, not only is the system not stable in open loop, but furthermore the signal to noise ratio is degraded.

Unlike a second-order linear resonator, the vibration of any nonlinear mechanical resonator vibrating in a favoured mode can be modelled by a Duffing equation, that is one including a $3^{rd}$ order nonlinear term:

$$m_{eff}\ddot{x}+c_{eff}\dot{x}+k_{eff}x+\alpha_{meca}x^3=F_{act}$$

where x is the vibration amplitude of a selected point of the resonator, $F_{act}$ is the actuating force imposed on the resonator and $\alpha_{meca}$ is the mechanical nonlinearity coefficient of the resonator. This coefficient is positive; the non-linearity is then said to be of the hardening type because, as clearly seen in FIG. 2, the resonance peak tilts toward the higher frequencies.

One technique for correcting this problem was described by L. C. Shao and al., *J. Micromech. Microeng.* 18 065014-9 (2008) and by M. Agarwal and al., presented at the IEEE International Electron Devices Meeting, Washington, D.C., IEEE (2005). This technique makes it possible to increase the vibration amplitude above the critical amplitude without degrading the noise. It consists of cancelling the coefficient or $\alpha_{meca}$ by adding a softening nonlinearity, i.e. one with a negative coefficient. This can be contributed by electrostatic actuation.

Figure 3:
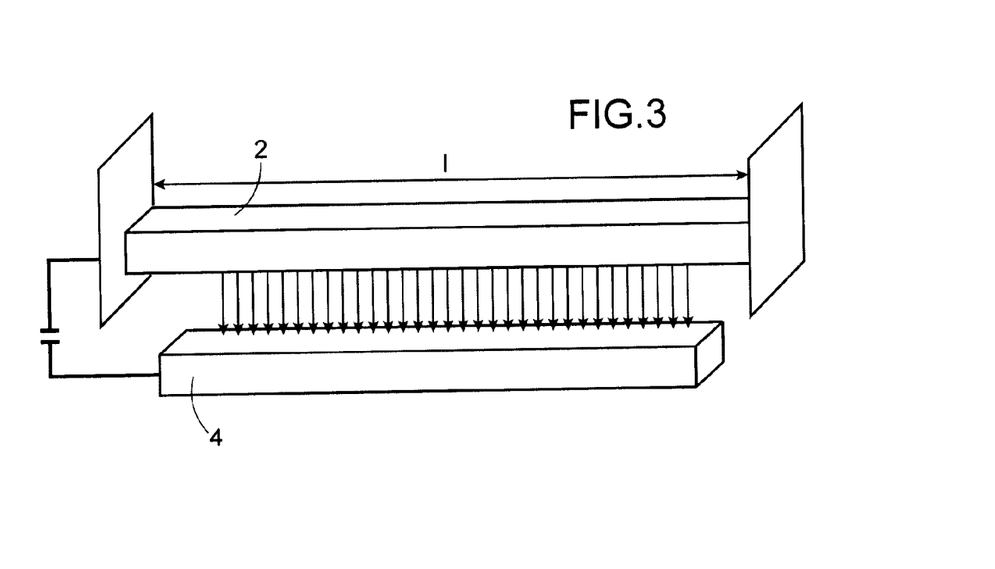

As an example of a resonator, the case of a planar capacitor, often used in MEMS, is selected, whose structure can be symbolised by a beam 2, actuated using an electrode 4, as illustrated in FIG. 3. The electrostatic force is expressed by:

$$F_{act} = \frac{1}{2}\varepsilon_0 S \frac{V^2}{(g-x)^2}$$

where S is the facing surface area, g the gap (that is the distance between the facing surface of the beam and the electrode), V the potential difference between the electrode and the resonator.

It is customary to handle this equation by carrying out a limited expansion of the force $F_{act}$, and the equation of motion becomes:

$$m_{eff}\ddot{x}+c_{eff}\dot{x}+(k_{eff}+\alpha_{elec})x+\alpha_{elec\,2}x^2+(\alpha_{meca}+\alpha_{elec\,3})x^3+\Sigma\alpha_{elec\,i}x^i=\lambda V^2$$

where the odd order coefficients $\alpha_{elec\,i}$ are negative.

It must also be noted that the even-order terms have no effect on resonance (linearisation of a quadratic term generates only terms that are multiples of the resonant frequency, and no term at the resonant frequency); they are therefore not a problem.

In particular, it is possible to cancel $(\alpha_{meca}+\alpha_{elec3})$ to cancel the hysteresis. This is what is shown in the articles by Shao and al. and by Agarwal and al., already cited above, but also in the article by Kozinski and al. *Appl. Phys. Lett* 88 253101 (2006).

This cancellation of the nonlinearities is tricky, however, because it is necessary to cancel rather accurately the terms of order 3. It is therefore only applicable in a limited operating range, and it is moreover only applicable when the higher terms (that is terms involving $x^i$, for i>3) are negligible.

Figure 4:
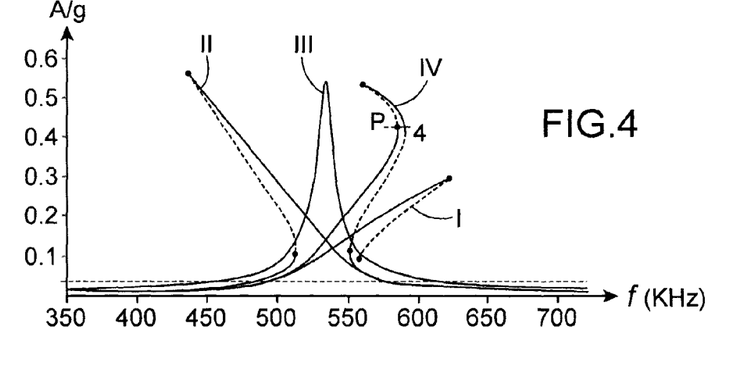

Moreover, it leads most of the time to the use of very high and unusable voltages. This explains why this technique is very little used in practice. This is all the more true in an NEMS for which the dimensions, and the gap in particular, are very small, and whose linear operating range is very limited. Thus the influence of terms higher than 3 quickly becomes very large at the usual dimensions of NEMSs, leading to the emergence of highly unstable mixed behaviour, first hardening, then softening. The problem is the same in the case of MEMSs. This behaviour is illustrated in FIG. 4, where A/g (where A is the mechanical vibration amplitude) is shown as a function of frequency and where:

Curve I represents the nonlinear case, described above, without electrostatic actuation, with a dominant coefficient $\alpha_{meca}$, and with $V_{dc}$=5 V and g=750 nm, Curve II represents another case of nonlinear behaviour with a dominant coefficient $\alpha_{elec3}$, and with $V_{dc}$=5 V and g=400 nm, Curve III represents a linear behaviour case, with a near-zero coefficient $\alpha_{meca}+\alpha_{elec3}$, and with $V_{dc}$=6 V and g=500 nm (and a critical mechanical amplitude of 15 nm), Curve IV represents a nonlinear behaviour case with non-negligible terms of order higher than 3 and with $V_{dc}$=8 V and g=750 nm.

In this figure, point P represents the point at which the terms of order 5 begin to have a noticeable influence. Here, it has an amplitude of 450 nm.

Also in this figure, the stable branches are shown with solid lines, the unstable branches with broken lines.

This behaviour makes this technique for cancelling $\alpha_{meca}+\alpha_{elec3}$ tricky because it is unstable, as was shown by Kacem and al., *Nanotechnology*, 20, 275501 (2009) and by N. Kacem and S. Hentz, in Appl. Phys. Lett., 95, 183104 (2009).

The problem that presents itself is therefore that of finding a new method and a new device, of the resonator type, that makes it possible to effect a suppression of the hysteresis effect (like that illustrated above in FIG. 2), in a stable manner, while still allowing the attainment of vibration amplitudes high enough to allow an effective reduction of the signal-to-noise ratio of the resonator.

DISCLOSURE OF THE INVENTION

The invention relates firstly to an electromechanical resonator including at least one deformable element, means for actuating that deformable element to apply to it, simultaneously, at least one first actuating force at a first frequency, and a second actuating force at at least one second frequency.

The first and the second frequencies create at least two simultaneous resonances at a resonant frequency equal to the frequency of one of the actuating forces.

The maximum deformation amplitude of the deformable element is greater than the critical mechanical amplitude of the resonator.

The actuating means can be of the electrostatic type, and be comprised of one electrode or several electrodes, which can be arranged parallel to at least one face of the movable element of the resonator.

A device according to the invention can include means for applying a first alternating voltage, for creating the first actuating force, and at least one second alternating voltage for creating the second actuating force.

Such a device can include as a deformable element a beam, embedded at one or both of its ends (this beam can in particular be a nanowire or a nanotube), or a membrane, or a plate or a substrate undergoing extensional vibration. The deformable element can be made at least partly of a semiconductor material, of silicon for example.

The invention also relates to a method for actuating an electromechanical or mechanical resonator comprising at least one deformable element, in which there is simultaneously applied to the deformable element at least one first actuating force at a first frequency, and at least one second actuating force at at least one second frequency.

The first and second frequencies create at least two simultaneous resonances at a resonant frequency equal to the frequency of one of the actuating forces.

The motion of the deformable element is of an amplitude greater than the critical mechanical amplitude of the resonator.

The present invention therefore proposes a device and a method for at least partial cancellation of hysteresis through the implementation of simultaneous resonances in order to negate the influence of the terms of order greater than 5 and to stabilise the cancellation of the nonlinearities. It is then possible to actuate the resonator at very high amplitudes in a linear fashion, and to take full advantage of the improvement in its performance.

The actuating forces can be applied electrostatically, using at least one electrode.

It is possible for instance to apply a first alternating voltage and at least one second alternating voltage.

In a device and a method according to the invention, the first alternating voltage ($V_1$) can be at a resonant frequency ($\omega_0$) of the device, and at least one second alternating voltage can be at a subharmonic frequency ($k\omega_0$, with k>1) or at a superharmonic frequency ($\omega_0/k$, with k>1). In one preferred embodiment, k=2.

In another embodiment, at least one first alternating voltage ($V_1$, $V_2$, $V_{ac}$) and one second, direct voltage ($V_{dc}$) are applied.

Preferably, the sum of the mechanical nonlinearity coefficient and the $3^{rd}$ order electrical nonlinearity coefficient is zero or nearly zero (the contribution of the terms of order 3 is negligible compared to the linear terms, for example less than 10% of the linear terms).

The use, for actuating the deformable element, of at least 2 simultaneous resonances in conformity with the invention makes it possible to operate in a linear regime in an operating range which would be nonlinear without this simultaneous resonance. The operation of the deformable element in a range thus made linear makes it possible to use deformation amplitudes greater than the state of the art and thus to increase the signal/noise ratio.

DETAILED DISCLOSURE OF THE EMBODIMENT OF THE INVENTION

Figure 13:
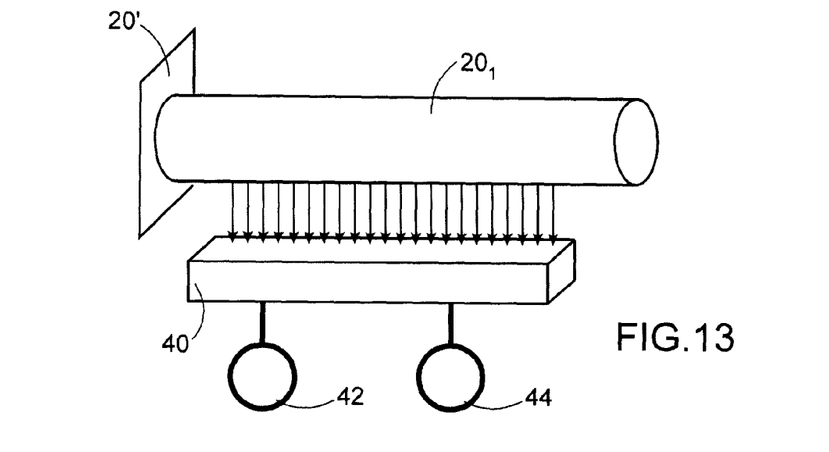
FIG. 13 shows a nanowire.

According to a first example of the invention, a nonlinear resonator is implemented, for example an embedded beam 20, to which are simultaneously applied a super- or subharmonic resonance and a primary resonance. Let us specify that a beam may have a square or rectangular cross section (as in the figures), or any cross-section in variation, particularly circular, as for a nanowire $20_1$ (as in FIG. 13) or a nanotube.

Let there be a non-linear resonator of order n to which is applied a force of amplitude F and of natural frequency $$\omega = \omega_0 = \sqrt{\frac{k_{eff}}{m_{eff}}}.$$

The equation of motion of this resonator is:

$$m_{eff}\ddot{x}+c_{eff}\dot{x}+k_{eff}x+\alpha_n x^n = F \cos \omega t$$

If the resonator were purely linear (that is, if $\alpha_n=0$) only a so-called primary resonance would be observed when $\omega=\omega_0$. The primary resonance is that at which there is resonance if the resonator is purely linear.

Due to the nonlinear terms, resonances of the resonator are observed in its natural mode at $\omega_0$ when $\omega=\omega_0/n$ (superharmonic resonance) and when $\omega=n\omega_0$ (subharmonic resonance).

Now let there be a resonator with dual excitation, meaning that the excitation force includes a component with amplitude $F_1$ (and with pulsation $\omega_1$) and a component with amplitude $F_2$ (and with pulsation $\omega_2$):

$$m_{eff}\ddot{x}+c_{eff}\dot{x}+k_{eff}x+\alpha_n x^n = F_1 \cos \omega_1 t + F_2 \cos \omega_2 t$$

It is thus possible to simultaneously excite the primary resonance with $\omega_1=\omega_0$ and a superharmonic or subharmonic resonance with $\omega_2=\omega_0/n$ or $\omega_2=n\omega_0$ (n>1).

We then have simultaneous resonances.

According to the invention, means are implemented for achieving this dual excitation and for regulating it so as to excite the primary resonance, at frequency $\omega_1=\omega_0$, up to amplitudes that drive the resonator into a nonlinear regime. In other words, the amplitude of motion is greater than the critical amplitude beyond which there can be several amplitudes for a one given frequency (in FIG. 1, this is the amplitude $A_c$ of point $P_0$). The critical amplitude is the boundary between a linear vibration regime and a nonlinear regime.

Further, the device is put in a condition where the terms of order 3 cancel or become negligible compared with the terms of order 1 (or the value of the terms of order 3 is less than 10%, or even 5%, of that of the terms of order 1). To this effect, it is possible to operate on the parameters of voltage amplitude, of gap g and of surface area S, but the simultaneous resonance also contributes to the reduction of the terms of order 3.

In terms of graphic representation, such as that in FIG. 4, this means that the limiting value (the position of point P) is extended, such that it is possible to employ greater amplitudes than those employed with linear behaviour only.

The invention makes it possible to stabilise the behaviour of the resonator due to the superposition of the subharmonic or superharmonic resonance and the primary resonance, thus cancelling hysteresis up to much greater amplitudes than without simultaneous resonance.

"Energy pumping" is thereby accomplished, by transferring energy from a first resonance to another (subharmonic or superharmonic) in order to stabilise the first one.

Figure 5:
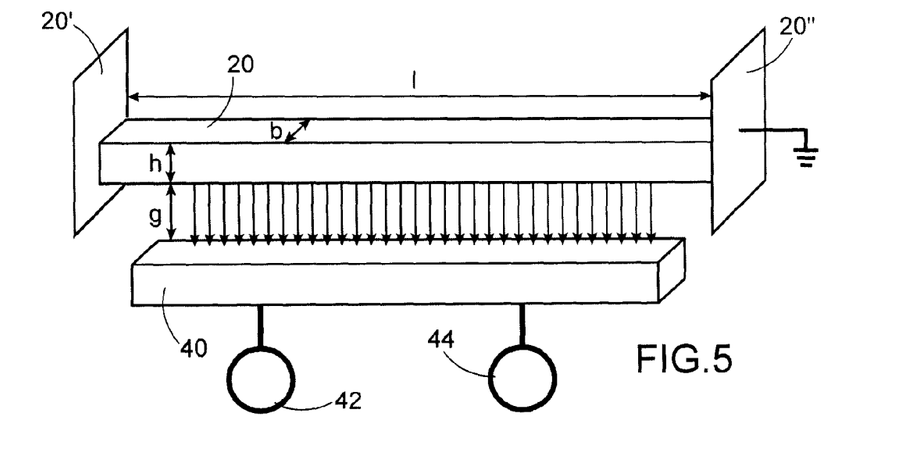
FIGS. 5 through 11 are embodiments of the invention.

One mode of implementation of the invention is illustrated in FIG. 5.

In this figure, the label 20 designates a beam, embedded in this example at both its ends 20', 20", this beam having a length l (of between 500 nm and 500 μm, for example, or else for example between 500 nm and 100 μm, or else for example between 500 nm and 10 μm), thickness h (for example between 10 nm and 10 μm, or else for example between 10 nm and 1 μm, or else between 10 nm and 500 nm for example) and width b (for example between 10 nm and 10 μm, or else for example between 10 nm and 1 μm, or else for example between 10 nm and 500 nm).

The label 40 designates an electrode, arranged substantially parallel to beam 20 at a distance or "gap" g from it (for example between 10 nm and 10 μm, or else for example between 10 nm and 1 μm, or else for example between 10 nm and 500 nm).

This electrode 40 is provided with voltage generating means 42, 44, which will respectively make it possible to apply to it:

an alternating voltage with amplitude $V_1$ and pulsation $\omega_1=\omega_0$ ($\omega_0$ is the primary frequency as defined above), superimposed on a direct voltage $V_{dc1}$, or with pulsation $\omega_1=\omega_0/2$ if $V_{dc1}=0$;

an alternating voltage of amplitude $V_2$ and pulsation $\omega_2=\omega_0/2$ (as a variation, $\omega_2=2\omega_0$ may be selected), superimposed on a direct voltage $V_{dc2}$; or with pulsation $\omega_2=\omega_0/4$ if $V_{dc2}=0$;

Therefore, according to this example, two harmonics are superimposed on one and the same electrode 40.

The length of the electrode and the gap are sized, along with $V_1$ and $V_2$, so as to simultaneously obtain the influence of the 2 resonances (primary and subharmonic or superharmonic) and to drive the resonator to vibration amplitudes greater than the critical mechanical amplitude.

Figure 6:
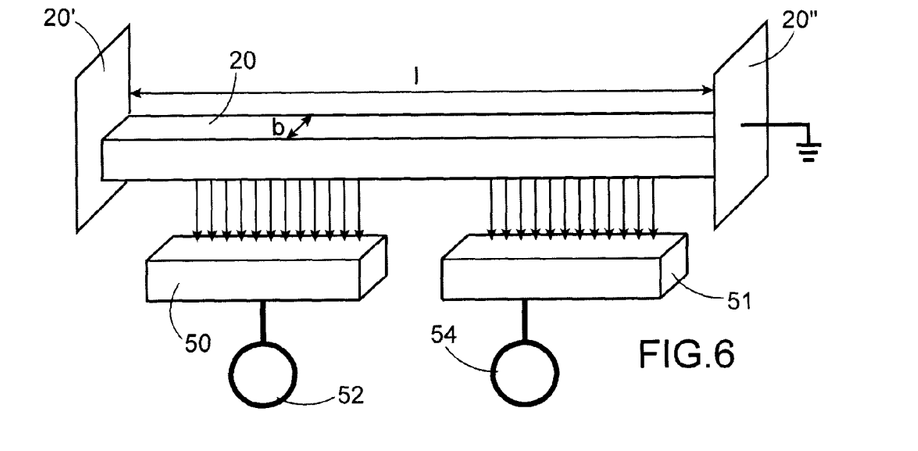

Another mode of implementation is illustrated in FIG. 6. According to this example, the harmonics are assigned to different electrodes 50, 51, located respectively at a distance $g_0$ and a distance $g_1$ from the beam 20.

In other words:

electrode 50 is provided with a voltage generator 52 which allows an alternating voltage of amplitude $V_1$ and pulsation $\omega_1=\omega_0$ to be applied to it, superimposed on a direct voltage $V_{dc1}$ ($\omega_0$ is the primary frequency as defined above); or with pulsation $\omega_1=\omega_0/2$ if $V_{dc1}=0$;

electrode 51 is provided with a voltage generator 54 which allows an alternating voltage of amplitude $V_2$ and pulsation $\omega_1=\omega_0/2$ to be applied to it (as a variation, $\omega_2=2\omega_0$ can be selected), superimposed on a direct voltage $V_{dc2}$; or with pulsation $\omega_2=\omega_0/4$ if $V_{dc2}=0$.

The length of electrodes 50 can be different from that of electrodes 51. Gap $g_0$ can be different from gap $g_1$. These parameters are sized, along with $V_1$ and $V_2$, in order to simultaneously obtain the influence of the 2 resonances (primary and subharmonic or superharmonic) and to drive the resonator to vibration amplitudes greater than the critical mechanical amplitude.

In the two examples that have just been described, obtaining 2 electrostatic forces at 2 different frequencies is accomplished with one or two alternating electrical signals.

Figure 7:
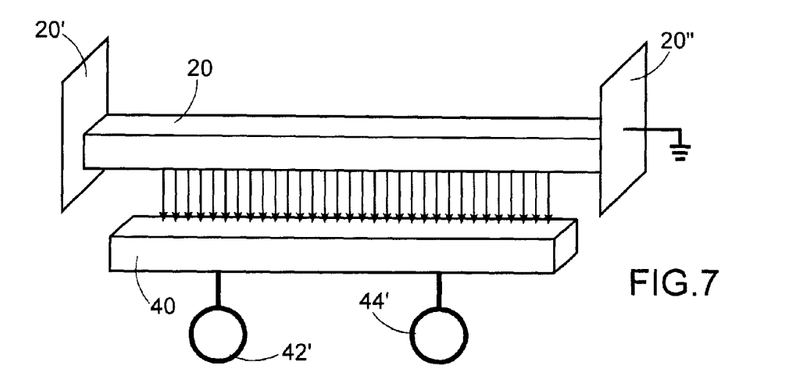

Another mode of implementation is illustrated in FIG. 7.

This structure comprises elements (beam 20, electrode 40) identical or similar to those already described above in connection with FIG. 5.

This time, electrode 40 is provided with voltage generating means 42', 44' which will make it possible to simultaneously apply to it, respectively:

an alternating voltage with amplitude $V_1$ and pulsation $\omega_1=\omega_0/2$ or $\omega_0$;

a direct voltage with amplitude $V_{dc}$.

Obtaining 2 electrostatic forces at 2 different frequencies is then accomplished with a single alternating electrical signal and a constant electrical signal.

In this case, electrostatic actuation is employed with superposition of a direct voltage and an alternating voltage.

Thus we have, if we confine ourselves to order 3:

$$m_{eff}\ddot{x}+c_{eff}\dot{x}+(k_{eff}+\alpha_{elec})x+\alpha_{elec2}x^2+(\alpha_{meca}+\alpha_{elec3})x^3=\lambda$$
$$(V_{ac}\cos\omega t+V_{dc})^2=\lambda_1 V_{ac}V_{dc}\cos\omega t+\lambda_2 V_{ac}^2\cos 2\omega t$$

Thus with a single alternating electrical signal having pulsation $\omega=\omega_0/2$ or $\omega_0$, an electrostatic force is obtained with pulsation $\omega_0$ that is responsible for the primary resonance, and an electrostatic force with pulsation $\omega_0/2$ responsible for the subharmonic resonance at $\omega_0$ (with pulsation $2\omega_0$ responsible for the subharmonic resonance at $\omega_0$), due to the nonlinear term of order 2 in the equation of motion.

This device can be made based on a device with known characteristics, having for example a lock-in in 2f mode (the amplitude of the output harmonic having twice the frequency of actuation is measured). It will be noted that, in known devices, values of the alternating voltage $V_{ac}$ and direct voltage $V_{dc}$ are used such that $V_{ac}\ll V_{dc}$, in order to be able to neglect one harmonic compared to the other. Obviously, the nonlinear range is avoided, hence the influence of the $2^{nd}$ harmonic is nonexistent. Here, on the contrary, comparable direct and alternating voltages are used ($V_{ac}$ is for example between $V_{ac}$ and $10V_{ac}$) which makes it possible to drive the resonator into the nonlinear range, in order to take advantage of the simultaneous resonances.

For each of the modes of implementation described, a direct voltage $V_{dc}$, superimposed on the other voltages, can either be used or not. Electrical characterisation can be accomplished for example with an off-the-shelf lock-in in 1f or 2f mode, depending on the resonance to be employed.

Each of the devices described can also include detection means, of the electrostatic or piezoresistive type, or another type, for example.

Figures 9, 10:
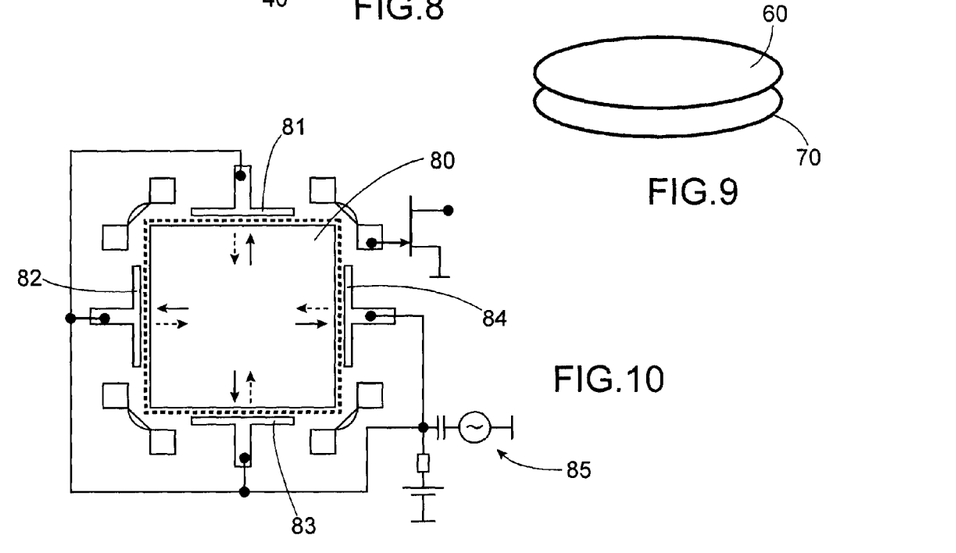

The mechanical structure of a device according to the invention can be:

a beam embedded at both ends 20', 20" (case of FIGS. 5-7) or at only one end 20' (case of FIG. 8), or a beam with other boundary conditions, for example simply supported on one end and embedded on the other end or simply supported on both ends;

the beam being possibly a nanowire $20_1$ (as in FIG. 13) or a nanotube, embedded at one end 20' (case of FIG. 13) or simply supported on one end or both ends;

or a membrane or a plate 60, flat, circular or square or rectangular or of any other shape, working in bending: this is the case in FIG. 9 where this plate 60 is arranged facing an electrode 70, for example of the same shape as that of the membrane or of the plate 60 and to which simultaneous resonances can be applied in the manner already explained above for a beam; it can be embedded over all or part of its periphery, or a structure in extensional mode: this is the case in FIG. 10. This type of device is explained in a more detailed manner in V. Kaajari et al., "Square extensional mode single-crystal micromechanical RF resonator," in *Proc. Transducers* 04, *Int. Conf. Solid State Sens. Actuators*, 2004, p. 951-954 and in "Square extensional mode single-crystal micromechanical resonator for low phase noise oscillator applications>>, IEEE *Electron. Device Lett.*, vol. 25, 4, p. 173-175, 2004. The motion of a plate or of a substrate 80 is then in its own plane, as shown by the arrows in FIG. 10 (other modes can be implemented, for example the Lamé mode); electrodes 81, 82, 83, 84, connected to means 85 for providing the desired voltages, allow actuation of these motions to which, in conformity with the invention, simultaneous resonances can be applied in the manner already explained above (the two voltages are applied to each electrode, or an alternating voltage is applied to two opposed electrodes and a direct voltage to the two other opposed electrodes, or an alternating voltage is applied to all 4 electrodes and a direct voltage to plate 80).

As given in the examples above, n=2 is used advantageously in the nonlinear terms of the equation of motion, that is to say harmonics of which one frequency is double the other. But other variations can be implemented, with a frequency $\omega_0$ and a frequency $k\omega_0$ or else $\omega_0/k$, with k>2.

Figure 11:
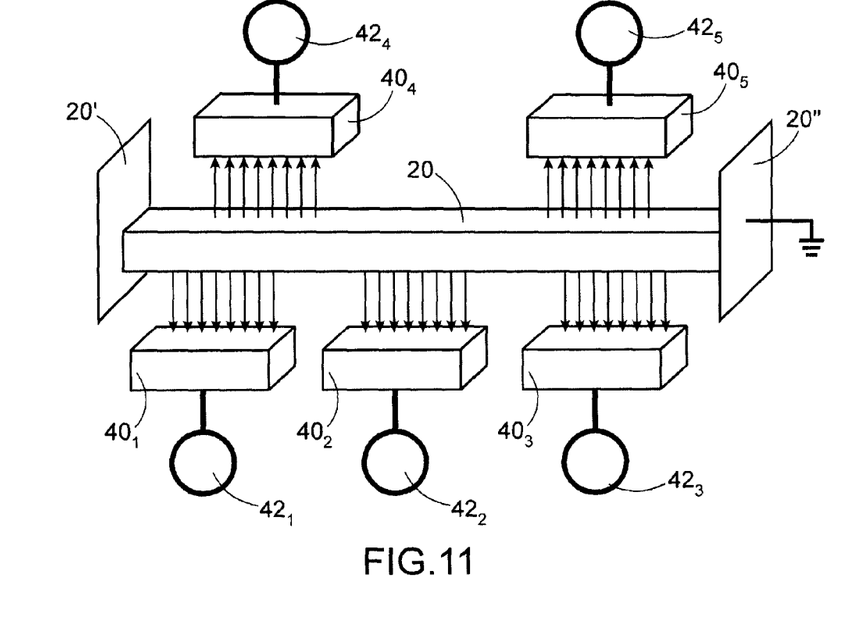

Yet another mode of implementation is that of FIG. 11, with n voltages applied having frequencies $\omega_1, \omega_2, \omega_3, \omega_4, \omega_5$. It can be assumed that $\omega_1=\omega_0$ (primary frequency).

According to this example, the harmonics are assigned to different electrodes $40_i$, (i=1, ... 5), located respectively at a distance $g_i$ from beam 20.

In other words each of the electrodes $40_i$ is provided with a voltage generator $42_i$ which will make it possible to apply to it an alternating voltage with amplitude $V_i$ and pulsation $\omega_1=\omega_0$, or $\omega_i=i\omega_0$ or $\omega_0/i$ which can be superimposed on a direct voltage $V_{dci}$.

The lengths $l_i$ of electrodes $40_i$ can be different from one another. The gaps $g_i$ of electrodes $40_i$ can be different from one another. These geometrical parameters are sized, along with $V_i$, so as to obtain the influence of the various resonances (primary and subharmonic or superharmonic) simultaneously.

More generally, let there be a system with n excitations:

$$m_{eff}\ddot{x} + c_{eff}\dot{x} + k_{eff}x + \sum_{i=2}^{n}\alpha_i x^i = \sum_{i=2}^{n} F_i\cos\omega_i t$$

It is then possible to simultaneously excite the primary resonance with $\omega_1=\omega_0$ and several sub- or superharmonic resonances with $\omega_i=\omega_0/i$ or $\omega_i=i\omega_0$ (i>1).

The invention therefore allows the attainment of a multi-excitation, adjusted so as to excite the primary resonance, up to amplitudes that put the resonator into a nonlinear regime and under conditions where terms of order 3 can cancel as already explained above.

The behaviour of the resonator is stabilised due to several sub- or superharmonic resonances, thus making possible the use of the device in an amplitude range free of hysteresis.

"Energy pumping" in cascade is thereby achieved, by transferring energy from a first resonance to a second resonance in order to stabilise the first.

This kind of excitation is very practical for nanoresonators.

In fact, the more that the size of devices is reduced, the more that nonlinearities of order at least equal to 5 limit the range of hysteresis suppression near the critical amplitude. At certain sizes (particularly those of a nanowire or of a nanotube; beam 20 can be a nanowire or a nanotube), a single resonance is not enough for the desired effect, that is the presence of a very large linear peak at a very large oscillation amplitude. Several electrodes can thus be used for a multi-excitation in simultaneous resonances (one excitation at the primary frequency $\omega_0$ and n (n>0) superharmonics $\omega_k$ (n≥k>0)).

No matter which embodiment is chosen, the cancellation of the hysteresis due to simultaneous resonances can be obtained in various ways. Described below is an experimental procedure for sizing a resonator intended for use according to the invention.

It is in fact possible to experimentally define the dimensions of the structure to approximate the desired overall performance, and in particular the desired operating frequency.

The gap g can be set so as to allow the desired vibration amplitude, that is the largest possible for the intended application. As explained above, the gap allows cancellation of the terms of order 3 and the influence of sub- or superharmonic resonance; an approximate rule consists of using a gap g on the order of magnitude of the vibrating dimension of the structure (this vibrating dimension is the height h of the beam in FIG. 5, measured substantially parallel to its direction of vibration); for example the gap is between 10 nm and 100 nm.

One then attempts to come as close as possible to the operating range where earlier work tried to cancel the terms of order 3. That is to say that one seeks to attain the so-called critical mechanical vibration amplitude $A_c$, either with only an alternating voltage, or by superimposing a direct voltage on this alternating voltage, but keeping $V_{ac} \ll V_{dc}$, as is always practiced in well-known fashion. The aim is then to observe a slight influence of the variation of these voltages, not only on the amplitude of the peak, but also on its shape.

The value of the alternating voltage can then be increased until the influence of higher-order terms is observed, that is mixed behaviour or sudden instabilities.

The following step consists of making use of the effect of the simultaneous resonances:

In the case where 2 alternating voltages are used: $V_1$ drives the primary resonance, and $V_2$ the sub- or superharmonic resonance. It is then possible to gradually increase the amplitude of the $2^{nd}$ harmonic, when 2 electrical signals are used, in order to stabilise the peak, then, iteratively, to increase $V_1$ and $V_2$ in succession little by little (in order to increase the amplitude while retaining linear behaviour).

When a single electrical signal is used (with an alternating component and a direct component), the primary resonance is governed by $V_{ac}^2$, and the sub- or superharmonic resonance by $V_{dc}V_{ac}$. One then tries to iteratively increase the voltages $V_{dc}$ and $V_{ac}$ to stabilise behaviour while still increasing the actuation amplitude.

Modelling can be resorted to predict approximately the voltage values to be used. Semi-analytical models can be used as explained in the article of Kacem et al., *J. Micromech. Microeng.* 20, 2010, to predict the amplitudes to be attained.

The optimal voltage $V_{dc}$ can be analytically estimated for a given configuration by balancing the two nonlinearities of order 3 (the mechanical component and the electrostatic component). This corresponds to equality of the two critical amplitudes (mechanical and electrostatic).

Figure 8:
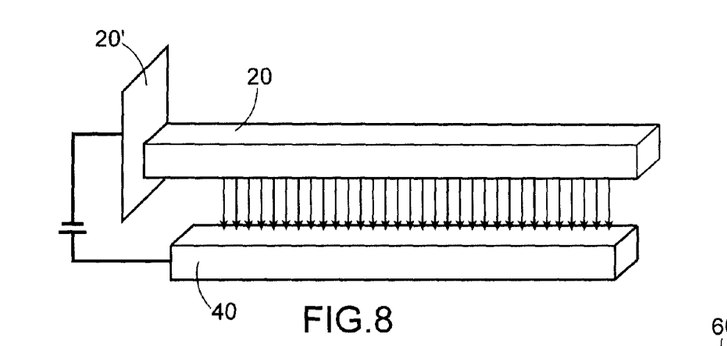

For example, in the case of a resonator of the type with a beam embedded at only one end 20' and free at the other end 20" (case of FIG. 8), the mechanical and electrostatic critical amplitudes are given respectively by the following expressions, drawn from the article of Kacem et al. cited earlier, where 1 is the length of the beam, Q the quality factor of the beam, and $A_{cm}$ the critical amplitude:

$$A_{cm} = 6.3 \frac{l}{\sqrt{Q}}$$

$$A_{ce} = 2 * 10^9 g^{\frac{5}{2}} \frac{h}{lV_{dc}\sqrt{Q}} \left( \frac{7.5 * 10^7 h^2}{l^4} - \frac{3.8 * 10^{-15} V_{dc}^2}{g^3 h} \right)^{\frac{1}{4}}$$

The optimal voltage $V_{dc}$ is therefore:

$$V_{dcOP} = \sqrt{\frac{1}{2}\sqrt{\frac{1.65 * 10^{39} g^{14} h^6}{l^{16}} + \frac{3.2 * 10^{42} g^{10} h^6}{l^{12}} - \frac{8.1 * 10^{19} g h^3}{l^8}}}$$

Once the DC voltage is determined, AC voltages are applied that are for example 2 to 5 times or 1 to 10 times lower than the DC voltage (as already explained above) to provide the energy pumping effect due to superharmonic resonance.

Preferably, this comes down to an adjustable system on which can be superimposed a number of superharmonics or subharmonics depending on the level of instability and the orders of the nonlinearities. This allows direct (active) control of the shape of the peak under simultaneous resonances. The higher the instabilities, the more correction is applied by adding superharmonics or subharmonics until the desired effect is obtained.

On the other hand, finite-element calculation can be resorted to. The procedure to be used remains the same as the experimental procedure described above.

In a device and a method according to the invention, the effect of sub- or superharmonic resonance is to negate the influence of the terms of order greater than 3.

As stated previously, these reveal themselves by so-called mixed behaviour, showing strong instabilities: the influence of these terms is visualised by the existence and amplitude of point P, on curve IV of FIG. 4.

It can be shown that, when only the primary resonance is used (without super- or subharmonics), the amplitude at this point P is determined only by the geometry of the device (dimensions of the resonator and gap). Thus the resonator's vibration range is limited by the emergence of higher-order terms, that is by the amplitude of this point P, which is itself determined by the geometry, with no possibility of changing it by any means including the operating voltages of the device. This range is therefore very limited.

On the other hand, the use of simultaneous resonances in conformity with the invention makes it possible to change the amplitude of this point P at will, and therefore to negate the influence of the higher terms, depending on the relative proportion of primary resonance and sub- or superharmonic resonance.

Figure 12:
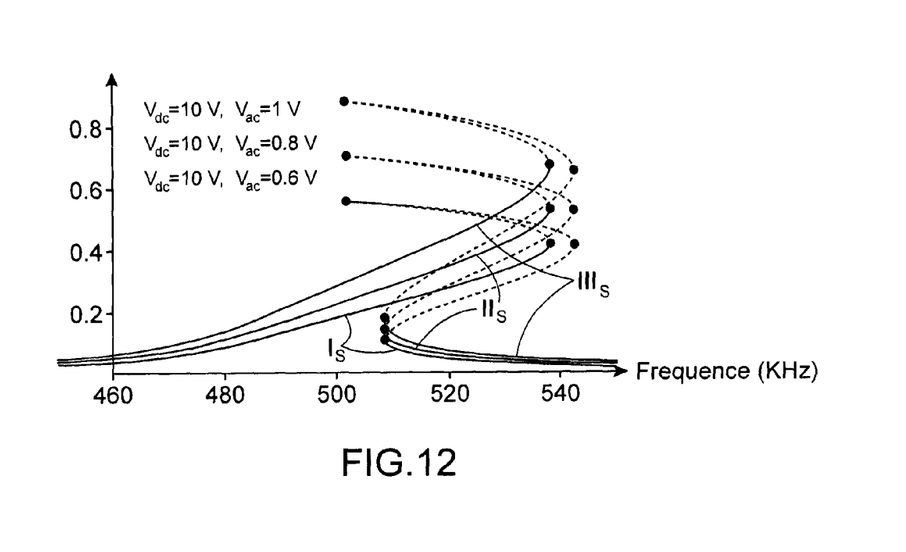
FIG. 12 shows the results obtained with a device according to the invention.

This is what is shown by FIG. 12 which shows, for 3 cases (identified by labels $I_s$, $II_s$, $III_s$), the mechanical vibration amplitude as a function of frequency in a simultaneous resonance regime according to the invention, obtained here by superposition of an alternating voltage of amplitude $V_{ac}$ (0.6 V for $I_s$, 0.8 V for $II_s$, 1 V for $III_s$), and of a direct voltage $V_{dc}$ (10 V for $I_s$, 10 V for $II_s$, 10 V for $III_s$). The stable branches are shown with solid lines, the unstable branches with broken lines. It can be seen that the ratio between $V_{dc}$ and $V_{ac}$ can even be a little outside the range already stated above. It will be noted that mixed behaviour is shown in this figure, with no suppression of the terms of order 3: if, in addition, conditions are sought which allow cancellation of these terms of order 3, a peak is then observed like that of curve III (FIG. 4), but with a much greater amplitude.

A device and a method according to the invention allow the power $P_0$ of the resonator's carrier to be increased, without increasing the generated noise. It is therefore possible to increase the signal to noise ratio, and hence the performance of the device, while still maintaining its stability and without degrading its noise.

Examples of a device to which the invention can be applied are described in the publications mentioned above. The article by N. Kacem et al., *Nanotechnology*, 20, 275501

(2009), also describes a technique for creating a resonator that implements the techniques of microelectronics based on an SOI substrate.

The article by L. C. Shao et al., *J. Micromech. Microeng.* 18 065014-9 (2008) describes the creation of another device, also based on an SOI substrate.

Another example of the creation of a resonator is described in J. Arcamone et al. "Full wafer fabrication by nanostencil lithography of micro/nanomechanical mass sensors monolithically integrated with CMOS," *Nanotechnology*, 19 (2008) 305302.

Yet another example of the creation of a resonator is given in connection with FIGS. 14A-14G.

Figure 14A:
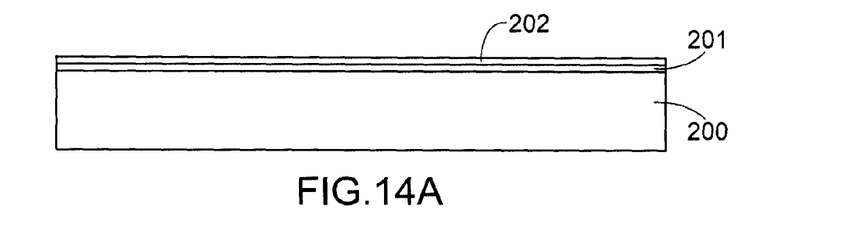
FIGS. 14A-14G are steps in the making of a resonator to which the invention can be applied.

The starting element, in FIG. 14A, is an SOI type substrate, including an oxide layer 201 about 1 µm thick on a silicon substrate 200, this oxide layer being covered with a thin layer of silicon 202 about 400 nm in thickness.

Figure 14B:
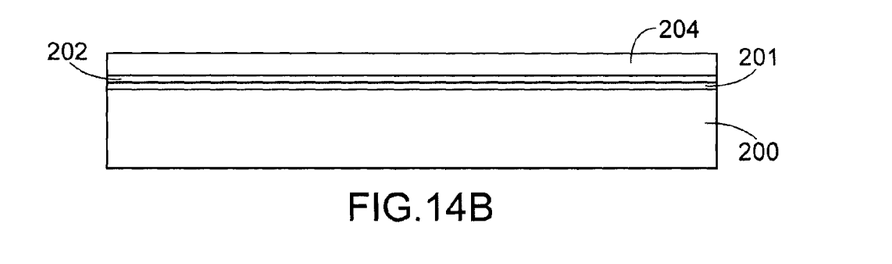
Figure 14C:
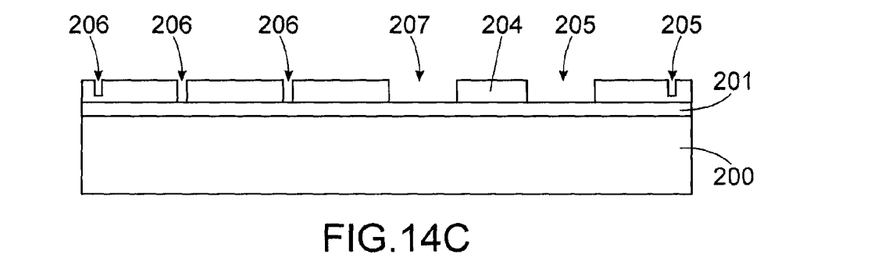
Figure 14D:
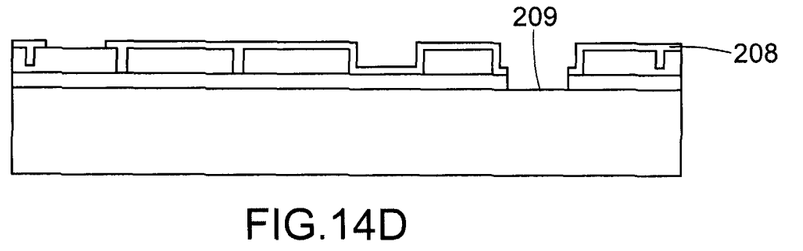
Figure 14E:
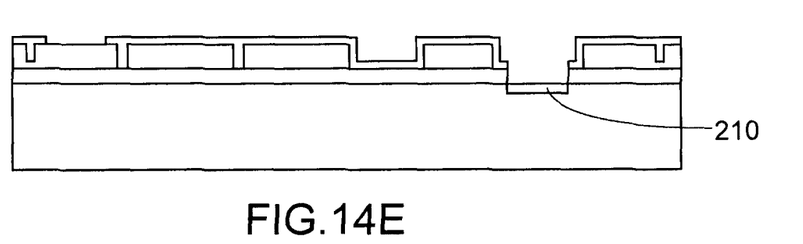
Figure 14F:
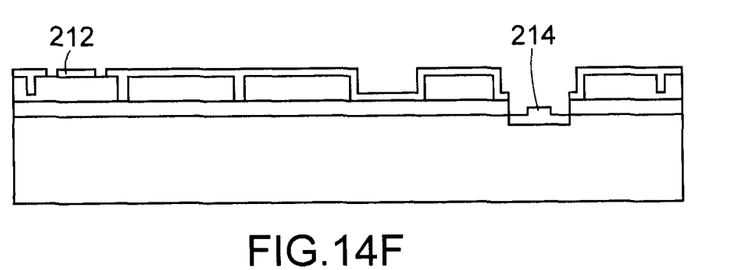
Figure 14G:
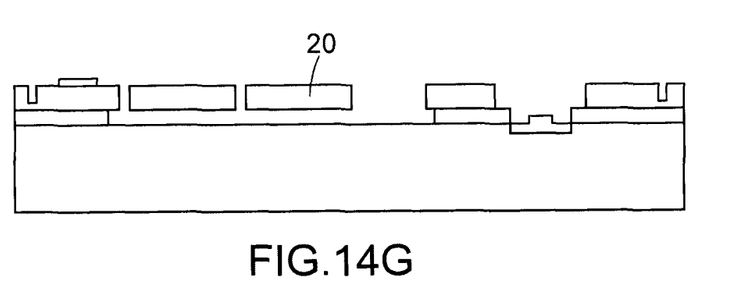

A silicon layer 204 is grown on this starting substrate by epitaxy, to a thickness of about 4 µm. This layer is doped in situ (FIG. 14B).

Lithography steps followed by etching will allow the definition of the geometry of an MEMS. Labels 205, 206, 207 designate, in FIG. 14C, etched areas of the surface layer 204.

A conformal layer of oxide 208 is then deposited (FIG. 14D), then photolithography and etching steps are carried out for the purpose of opening areas 209 for forming connection pads.

Implantation of boron makes it possible to define these pads 210 (FIG. 14E), which are completed (FIG. 14F) with a deposit of a material forming the contacts, AlSi for example, to which photolithography and etching steps can be applied in order to give good definition to the pads.

Finally, (FIG. 14G), the resonator 20 itself is freed, by vapour phase HF attack on the oxide layer 201.

The invention claimed is:

1. An electromechanical resonator comprising:
at least one non-linearly deformable element, and
actuating means for simultaneously applying, to said at least one non-linearly deformable element, at least one first actuating force at a first frequency, equal to a resonant frequency $\omega_0$ of said resonator, and at least one second actuating force at a second frequency, equal to a subharmonic resonant frequency $k\omega_0$, with $k>1$, k being an order of non linearity of the at least one non-linearly deformable element, of said resonator, or to a superharmonic resonant frequency $\omega_0/k$, with $k>1$, of said resonator, said first and second actuating forces creating at least two simultaneous resonances inducing vibrations of said at least one non-linearly deformable element at one single frequency that corresponds to the first frequency.

2. The resonator according to claim 1, the means of actuation being of the electrostatic type, and including at least one electrode.

3. The resonator according to claim 2, including means for applying to said at least one electrode at least one first alternating voltage for generating the first actuating force and a second alternating voltage for generating the second actuating force.

4. The resonator according to claim 3, the first alternating voltage being at said first frequency, this being selected to be equal to the resonant frequency of the device, and the second alternating voltage being at said second frequency.

5. The resonator according to claim 2, including means for applying, to said at least one electrode, at least one first alternating voltage and one second, DC voltage.

6. The resonator according to claim 1, in which k=2.

7. The resonator according to claim 1, in which the deformable element is a beam, anchored at one or both of its ends, or a membrane, or a plate or a substrate undergoing bulk vibration.

8. The resonator according to claim 1, in which the deformable element is a nanowire or a nanotube.

9. The resonator according to claim 1, an equation of motion of said resonator comprising a mechanical nonlinearity term and an electrical nonlinearity of order k=3, the amplitude of the first actuating force and the amplitude of the second actuating force being such that the sum of said mechanical nonlinearity term and said electrical nonlinearity term of order 3 is zero or nearly zero.

10. A method for actuating an electromechanical resonator including at least one non-linearly deformable element, said method comprising:
simultaneously applying to said deformable element at least one first actuating force at a first frequency, equal to a resonant frequency $\omega_0$ of said resonator, and at least one second actuating force at one second frequency equal to a subharmonic resonant frequency $k\omega_0$, with $k>1$, k being an order of non linearity of the at least one non-linearly deformable element, of said resonator, or to a superharmonic resonant frequency $\omega_0/k$, with $k>1$, of said resonator, said first and second forces creating at least two simultaneous resonances, inducing vibrations of said at least one non-linearly deformable element at one single frequency equal to one single frequency that corresponds to the first frequency.

11. The method according to claim 10, the actuating forces being applied electrostatically using at least one electrode.

12. The method according to claim 11, in which at least one first alternating voltage and one second, DC voltage are applied to said at least one electrode.

13. The method according to claim 11, in which at least one first alternating voltage and at least one second alternating voltage are applied to said at least one electrode.

14. The method according to claim 13, the first alternating voltage being the first frequency, this being selected equal to the resonant frequency of the device, and at least one second alternating voltage being equal to said second frequency.

15. The method according to claim 10, in which k=2.

16. The method according to claim 10, the equation of motion of said resonator comprising a mechanical nonlinearity term and an electrical nonlinearity term of order k=3, the amplitude of the first actuating force and the amplitude of the second actuating force being such that the sum of said mechanical nonlinearity term and said electrical nonlinearity coefficient of order 3 is zero or nearly zero.

17. An electromechanical resonator comprising:
at least one non-linearly deformable element, and
at least one electrode to apply to said non-linearly deformable element, simultaneously, at least one first actuating force at a first frequency, equal to a resonant frequency $\omega_0$ of said resonator, and at least one second actuating force at a second frequency, equal to a subharmonic resonant frequency ($k\omega_0$, with $k>1$, k being the order of non linearity of the at least one non-linearly deformable element) of said resonator, or to a superharmonic resonant frequency ($\omega_0/k$, with $k>1$), said first and second forces creating at least two simultaneous resonances inducing vibrations of said at least one non-linearly deformable element at one single frequency equal to one single frequency that corresponds to the first frequency.

18. The resonator according to claim 17, including at least one generator applying at least one first alternating voltage and a second alternating voltage to said at least one electrode.

19. The resonator according to claim 17, including at least one generator applying electrode at least one first alternating voltage and at least one generator applying a DC voltage to said at least one electrode.

20. The resonator according to claim 17, an equation of motion of said resonator comprising a mechanical nonlinearity term and an electrical nonlinearity term of order 3, the amplitude of the first actuating force and the amplitude of the second actuating force being such that the sum of said mechanical nonlinearity term and said electrical nonlinearity term of order 3 is zero or nearly zero.

* * * * *